US006400065B1

(12) United States Patent
Toda et al.

(10) Patent No.: US 6,400,065 B1
(45) Date of Patent: Jun. 4, 2002

(54) OMNI-DIRECTIONAL ULTRASONIC TRANSDUCER APPARATUS AND STAKING METHOD

(75) Inventors: Minoru Toda, Lawrenceville, NJ (US); Kyung-Tae Park, Berwyn, PA (US); Susan Huang Zaks, Norristown, PA (US); Jeffrey D. Swan, West Chester, PA (US)

(73) Assignee: Measurement Specialties, Inc., Fairfield, NJ (US)

( * ) Notice: Subject to any disclaimer, the term of this patent is extended or adjusted under 35 U.S.C. 154(b) by 0 days.

(21) Appl. No.: 09/281,247

(22) Filed: Mar. 30, 1999

Related U.S. Application Data

(60) Provisional application No. 60/080,100, filed on Mar. 31, 1998.

(51) Int. Cl.[7] ................................................ H01L 41/08

(52) U.S. Cl. ........................ 310/334; 310/369; 310/800

(58) Field of Search ................................ 310/334, 336, 310/337, 800, 369, 324

(56) References Cited

U.S. PATENT DOCUMENTS 3,792,204 A * 2/1974 Murayama et al. ..... 310/800 X
3,832,580 A * 8/1974 Yamamuro et al. ..... 310/800 X
3,862,477 A * 1/1975 Ayers et al. ............ 310/800 X
4,486,869 A * 12/1984 Carter ..................... 310/800 X
4,825,116 A * 4/1989 Itoh et al. ............... 310/800 X
5,357,486 A * 10/1994 Pearce ..................... 310/800 X
5,361,240 A * 11/1994 Pearce ..................... 310/800 X

* cited by examiner

*Primary Examiner*—Mark O. Budd
(74) *Attorney, Agent, or Firm*—Duane Morris LLP

(57) ABSTRACT

A transducer apparatus is disclosed having a spool member with a body portion and first and second elevated regions formed on the body portion. A PVDF film surrounds the spool member, the film including an inner surface facing the spool member and an outer surface opposite the inner surface. The film as surrounding the spool member has a predetermined frequency of resonance. Lateral ends of the film are secured together by a securing material. The securing material is such that the secured ends of the film will have substantially the same resonance frequency as a remainder of the film. The film includes a non-electrode area at a perimeter of the inner surface and an electrode material formed on a remainder of the inner surface. Upon securing the lateral edges of the film together, the securement is at overlapping non-electrode lateral edges of the film. The securing material may be any one of an adhesive in combination with screws or thermally deformable nails, adhesive alone, tape, or ultrasonic welding.

6 Claims, 7 Drawing Sheets

OMNI-DIRECTIONAL ULTRASONIC TRANSDUCER APPARATUS AND STAKING METHOD

RELATED APPLICATIONS

This application is related to co-pending provisional patent application Ser. No. 60/080,100 filed on Mar. 31, 1998 entitled OMNI-DIRECTIONAL ULTRASONIC TRANSDUCER APPARATUS and to co-pending commonly assigned patent application Ser. No. 09/281,247, filed on Mar. 30, 1999, entitled OMNI-DIRECTIONAL ULTRASONIC TRANSDUCER APPARATUS HAVING CONTROLLED FREQUENCY RESPONSE.

FIELD OF THE INVENTION

The present invention relates to the field of transducers. More particularly, the present invention relates to an omni-directional ultrasonic transducer apparatus.

DESCRIPTION OF RELATED ART

In the environment of transducers, it is known that an ultrasonic transducer may be formed with either a linear or curved film incorporated therein. In the event that a curved film is used, the ends of the curved film are butted up against each other with no apparent connection between the butted ends. Each of the types of film is described in the following.

Referring first to FIG. 7, a linear polymer piezoelectric film 70 is shown. When an AC voltage is applied to electrodes 72 on surfaces of the film 70, the film length in the molecular chain direction shrinks or expands. In other words, the PVDF film (the polymer piezoelectric material) is stretched during the process and molecular chains are aligned in parallel. This is due to excitation in the linear direction.

Alternatively, a cylindrical piezoelectric film 74 is shown in FIG. 8 whereby the stretched axis is wrapped around a cylinder (not shown). Here, when an AC voltage is applied to electrodes 76 on surfaces of the cylindrical film 74, the length vibration is converted to radial vibration. This is the principle of PVDF tweeter as disclosed in "Electroacoustic Transducers with Piezoelectric High Polymer Films". J. Audio Eng. Soc. Vol. 23, No. 1, pp. 21–26, (1975) by M. Tamura et al. The high polymer element in the piezoelectric film is a poly-vinylidene fluoride) (PVDF) in film form.

The cylindrical PVDF vibrator has a certain mass and stiffness for radial expansion or shrinkage, and this mass and stiffness enable a resonance whose frequency is $$f_0=(1/2pR)\text{Ö}Y/r \qquad (1)$$

where

R is the radius in meters, Y is Young's modulus ($N/m^2$), and r is density ($Kg/m^3$).

This equation is shown in a paper by A. S. Fiorillo entitled "Design and Characterization of a PVDF Ultrasonic Range Sensor". IEEE Trans. Ultrasonics, Ferroelectrics and Frequency Control". Vol. 39, No. 6, pp. 688–692 (1992), which is for semi-circularly curved film with both ends clamped, but it has the same resonance frequency as a cylinder.

In the IEEE paper, the cylindrical PVDF film is mounted on a conventional smooth-sided spool. The radius of the spool determines the resonance frequency through equation (1). The PVDF film can be directly wrapped around a cylindrical surface of the spool with almost no gap between the surface of the film and the surface of the spool. Even though the appearance is of no gap, the film is actually supported on the spool by many tiny points of surface roughness. It has been determined that most of the supported area has gaps of from 2–20 microns between the contacts of the many tiny points of surface roughness. Since actual vibration amplitudes are about 1 micron peak to peak for a 150 Vpp drive, there are enough spaces to vibrate and actually permit the device to work. In addition, the film is bonded to the underlying device or cylinder in order to secure the film and prevent its movement.

However, in the known application of a film to a spool as described, a problem has been discovered by the inventors of the instant application. Specifically, it has been discovered that with the "gap-free" wrapping of semi-cylindrical or cylindrical film attempted in the known art, there are problems of uncontrollable resonance frequency and a reduced vibration of the PVDF film. In addition, it has been discovered by the instant inventors that the bonding of the film to a film support, such as a cylinder, contributes to the problems of uncontrollable resonance frequency and reduced vibration of the PVDF film.

In other words, since the air found in the 2~20 micron region (the "back air space") has stiffness and spring effect, this also increases the effective stiffness of the PVDF film and in turn increases the resonance frequency of the film. Also, many points of contact are present between the cylinder and the PVDF film, including the bonding of the film to the cylinder, such that energy is lost due to friction, and the vibration of the PVDF film is thereby reduced. Since a thickness of the back air space is not controlled in the known art, nor recognized that it could or should be controlled, the resonance frequency also can not be controlled. Instead, it has been discovered by the inventors that if back air thickness exceed a certain value, the spring effect of the back air becomes less and even becomes negligible. In accordance with the principles PVDF film around a cylinder, when the PVDF film is wrapped, a seam may be created at the joined ends of the film. The inventors have discovered that certain connections at the seam location, instead of bonding the PVDF film to the cylinder, will significantly reduce the ultrasonic wave pressure radiated from that side of the cylindrical film, thereby improving the reliability of the device. In effect, the inventors have discovered that the seam should vibrate at the same frequency as the remainder of the film to achieve an optimum operation of the transducer apparatus.

Accordingly, a need in the art exists for an ultrasonic transducer apparatus in which a sealing or fixing of the vertical edges of the PVDF film will not significantly reduce the ultrasonic wave pressure radiated from that side of the cylindrical film. Enabling of the joined edges of the PVDF film to vibrate has been discovered by the inventors to enhance the effect of the transducer apparatus in a manner not heretofore known in the art.

OBJECTS AND SUMMARY OF AN EMBODIMENT OF THE INVENTION

It is an object of an embodiment of the invention to provide an ultrasonic transducer apparatus having a controlled resonance frequency.

It is another object of an embodiment of the invention to provide an ultrasonic transducer apparatus having a wrapped film surrounding a spool.

It is yet another object of an embodiment of the invention to provide an ultrasonic transducer apparatus wherein edges of the film surrounding the spool are joined so as to substantially enhance ultrasonic wave pressure radiating from that location.

It is a further object of an embodiment of the invention to provide an apparatus and method for attaching the piezoelectric film to a printed circuit board via ultrasonic staking.

It is a still further object of an embodiment of the invention to provide a cost effective ultrasonic transducer apparatus for eliminating the problems found in the known art of ultrasonic transducers.

These and other objects of the present invention are achieved by providing a transducer apparatus having a spool member with a body portion and first and second elevated regions formed on the body portion. A PVDF film surrounds the spool member, the film including an inner surface facing the spool member and an outer surface opposite the inner surface. The film as surrounding the spool member has a predetermined frequency of resonance. Lateral ends of the film are secured together by a securing material. The securing material is such that the secured ends of the film will have substantially the same resonance frequency as a remainder of the film. The film includes a non-electrode area at a perimeter of the inner surface and an electrode material formed on a remainder of the inner surface. Upon securing the lateral edges of the film together, the securement is at overlapping non-electrode lateral edges of the film. The securing material may be any one of an adhesive in combination with screws or thermally deformable nails, adhesive alone, tape, or ultrasonic welding.

Advantages of an embodiment of the invention as described more fully hereinbelow include a cost effective assembly for providing an ultrasonic transducer assembly having improved resonance and reduced vibration. This is accomplished by uniquely connecting joined edges of a PVDF film wrapped around a spool of the transducer assembly.

Additionally, the ultrasonic transducer of the instant disclosure has improved mass production ability and reduces the complexity and cost previously associated with the use of ultrasonic transducers in a manner not previously known in the art.

BRIEF DESCRIPTION OF THE DRAWINGS

The present invention will become more fully understood from the detailed description given by way of illustration only, and thus are not limitative of the present invention, and wherein.

DETAILED DESCRIPTION OF THE INVENTION

While the present invention may have many applications, an exemplary application and related description follows. Specifically, a purpose of the present invention is to provide an ultrasonic transducer apparatus having improved resonance and reduced vibration. Still further, a purpose of the present invention is to provide an ultrasonic transducer apparatus having improved resonance and reduced vibration at joined edges of a PVDF film. To that end, the following is a detailed description of an embodiment according to the teachings of the present invention.

Figure 1:
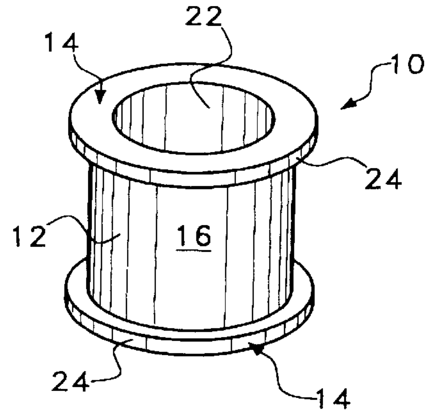
FIG. 1 is a perspective view of a spool for an ultrasonic transducer apparatus.

Referring first to FIG. 1, there is illustrated a spool 10 for use with an ultrasonic transmitter (FIGS. 3 and 5) in connection with the present invention. The spool 10 is of a unique shape and includes a cylindrical body portion 12 and a pair of elevated regions 14 surrounding the cylindrical body portion 12. The cylindrical body portion 12 has an outer peripheral surface 16, an inner surface 18, and opposite ends 20. The inner surface 18 defines a longitudinal opening 22 of a uniform cylindrical shape corresponding to the shape of the cylindrical body portion 12.

The elevated regions 14 of the spool 10 are integrally formed with the body portion 12 of the spool 10 and may either be of a one-piece construction with the body portion 12 or attached to the body portion by suitable securing methods. As shown, there are two elevated regions 14. Each elevated region 14 is coextensive with one of the opposite ends 20 of the cylindrical body portion 12 so as to extend therefrom and terminates in an outer edge 24 of the elevated region 14.

The positioning of the elevated region 14 at opposite ends 20 of the cylindrical body portion 12 has been found to be optimal for the ultrasonic transmitter of the present invention. However, this arrangement should not be construed to eliminate the possibility of the elevated region 14 being set in from one or more opposite ends 20 of the cylindrical body portion 12 of the spool 10. Further, the outer peripheral edge 24 of the elevated region 14 is shown to be at least 0.1 mm from the outer peripheral surface 16 of the body portion 12. The determination of that minimum distance and its effect will be described in the following.

Figure 2:
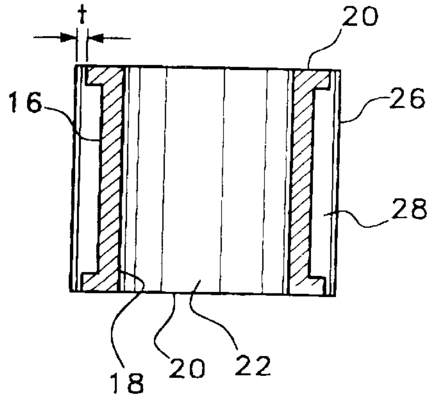
FIG. 2 is a side view of the spool shown in FIG. 1 with a film wrapped around the spool.

Referring now in further detail to FIG. 2, there is shown a film 26 wrapped around the spool 10. More specifically, the film 26 is a PVDF film modified from the type used in the conventional art in a manner to be described. As used in the present invention, the film is generally an elongated strip shape as better shown in FIG. 6, and includes longitudinal edges 26*a* and 26*b,* and lateral edges 26*c* and 26*d.* The film 26 likewise includes an inner face 27 and an outer face 30. As shown in FIG. 2, the film 26 is positioned to surround the outer peripheral edge 24 of the elevated region 14 rather than being in direct surface contact with the body portion 12 of the spool. The distance between the outer peripheral surface 16 of the cylindrical body portion 12 and the outer edge 24 of the elevated region is at least 0.1 mm. The positioning of the film around the outer edge 24 creates a back air area 28 between an inner surface 27 of the film 26 and the outer peripheral surface 16 of the cylindrical body portion 12.

The reason for the distance between the outer peripheral surface 16 of the body portion 12 and the outer peripheral edge 24 of the elevated region 14, is to provide an effective spring constant between the body portion 12 of the spool and the wrapped film 26. The effective spring constant of the back air area 28 is given by $$K_a=2p\mathrm{RHrV}_S^2/d \qquad (2)$$

where d is the back air gap in meters, R is the radius of the film, H is the height of the cylinder in meters, here shown at approximately 12 mm, r is the air density measured by 1.3 Kg/m$^3$, and $V_S$ is the sound velocity at 344 m/s.

The effective spring of the PVDF cylinder is $$K_p=2p\mathrm{HYt/R} \qquad (3)$$

where

Y is the effective Young's modulus of PVDF with approximately [5~6×10$^9$ N/m$^2$] Ag/C electrodes (6×10$^9$ N/m$^2$), and t is the total thickness with electrodes at approximately 30~50 mm.

In order for $K_a$ to become 1/10 of $K_p$, d has to be greater than $0.9\times10^4 1/t$, (where 1 is the wavelength) which is 0.1 for the above parameters. Therefore the film 26 has to be held with a certain space between the film 26 and the outer peripheral surface 16 of the cylindrical body 12. Accordingly, the opposite ends 20 of the spool 10 have the elevated regions 14 as shown.

Figure 6:
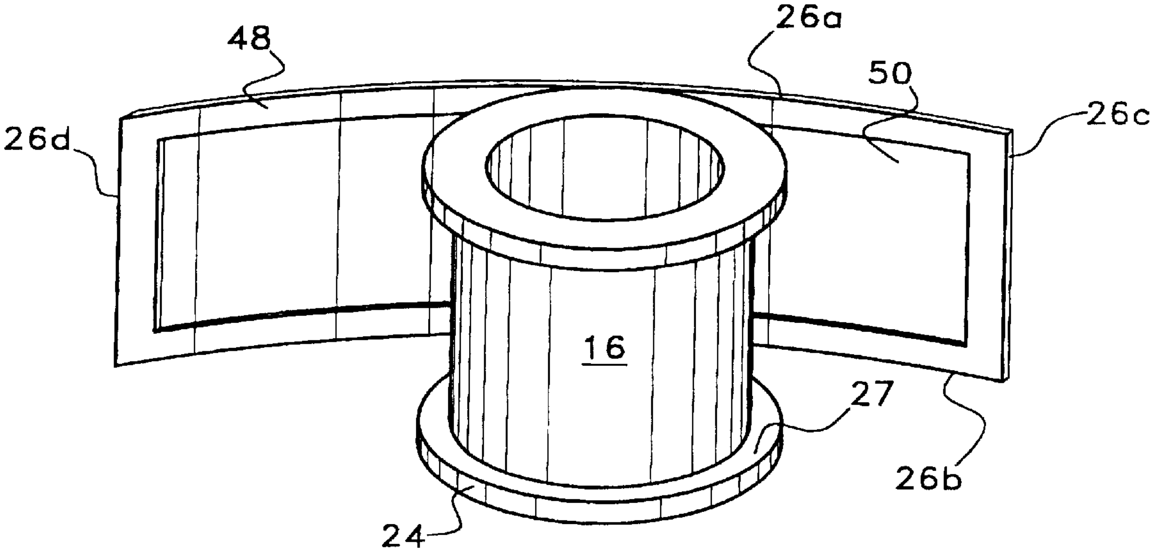
FIG. 6 is a perspective view of the spool with an unwrapped film according to a third embodiment of the present invention.
Figure 7:
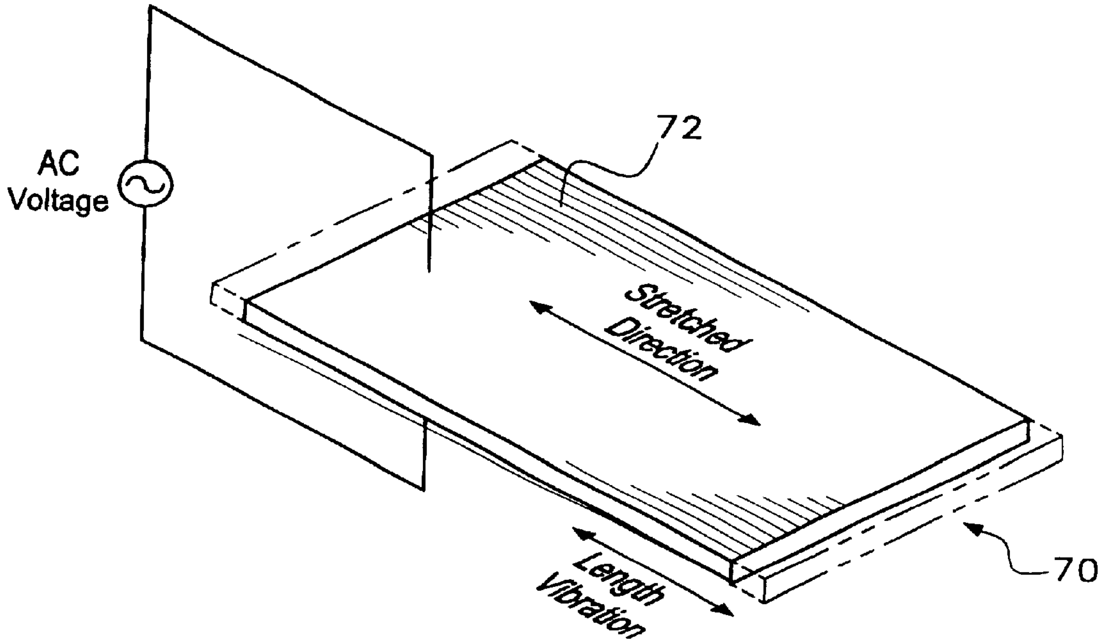
Fig. 7 (PRIOR ART)
FIG. 7 is a perspective view of a conventional PVDF film.
Figure 8:
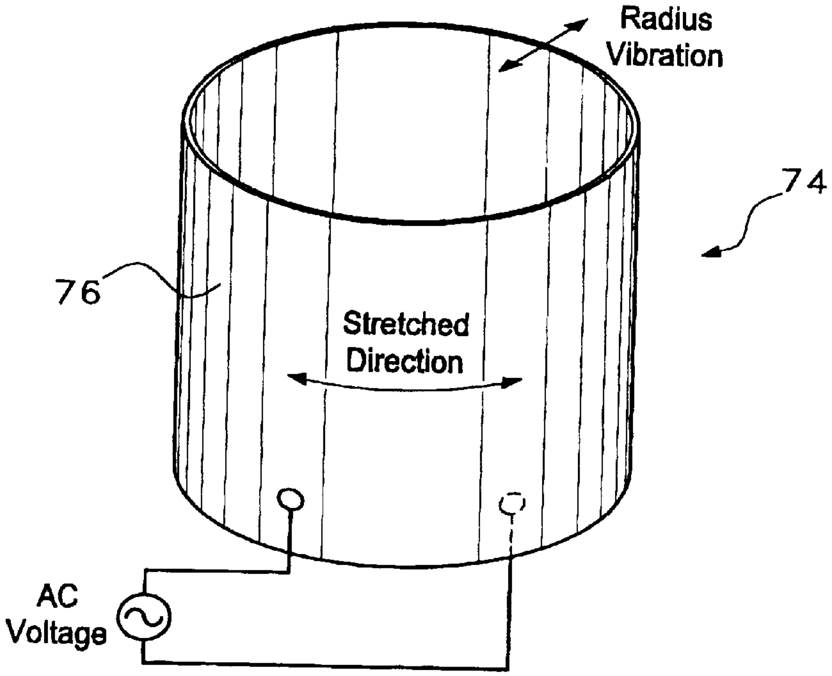
Fig. 8 (PRIOR ART)
FIG. 8 is a perspective view of the conventional PVDF film of FIG. 5 applied to a conventional spool.

The film 26 has a uniform radial vibration motion from top to bottom (edge 26*a* to edge 26*b* of the film 26 as can be seen in FIG. 6) if the film 26 is not bonded to anything. If the edge areas 26*a* and 26*b* of the film 26 are bonded to the elevated regions 14, respectively, the bonded regions 26*a* and 26*b* will not vibrate but the remaining non-bonded area will vibrate. Although the transducer characteristics such as the resonance frequency and the output pressure are not much different for either case, it is preferred that there is no bonding between the film 26 and the outer edges 24 of the elevated regions 14. Not only are production and a processing of the transducer apparatus simplified when an extra step of bonding is eliminated, but the resonance frequency is improved and vibration is reduced.

Figure 3:
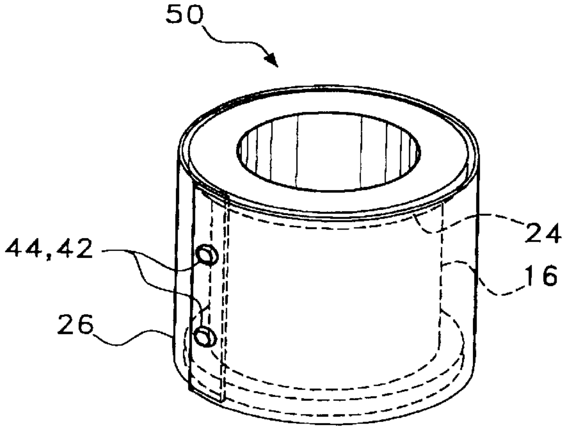
FIG. 3 is a perspective view of the combined spool and film showing a first embodiment of joining edges of the film.

Turning now to FIG. 3, the film 26 must be secured in some fashion to itself when wrapped around the spool 10. In general, one end 26*c* of the film 26 is joined to the opposite end 26*d* by overlapping the opposite ends and securing the same together. In FIG. 3, the ends 26*c* and 26*d* of the film 26 are secured together by overlapping the same and fixing the lateral edges with an adhesive 40 and at least one of screws 42 or thermally deformable nails 44. Securing of the lateral edges by adhesive 40 and either one of screws 42 or thermally deformable nails 44 significantly reduces the ultrasonic wave pressure radiated from the back side of the film 26 as defined by a location of the joined lateral edges.

The use of adhesive 40 in combination with screws 42 is shown as a joining device in FIG. 3. In essence, the edges 26*c* and 26*d* are overlapped and the adhesive 40 is applied between the overlapped edges. The addition of either screws 42 or thermally deformable nails 44 are used in combination with the adhesive 40. In any case, the securing is done as close to the edges as possible so as to prevent any significant interference with the remainder of the film 26 when the film 26 resonates.

Figure 4A:
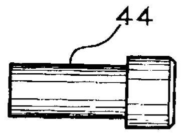
FIG. 4A is a side view of a thermally deformable nail used in the option of FIG. 3 prior to thermal deformation.
Figure 4B:
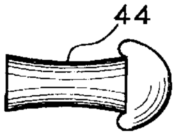
FIG. 4B is a side view of the thermally deformable nail used in the option of FIG. 3 subsequent to thermal deformation.

FIGS. 4A and 4B show the alternative thermally deformable screw 44 and how the screw 44 appears before (FIG. 4A) and after (FIG. 4B) thermal deformation thereof.

Figure 5:
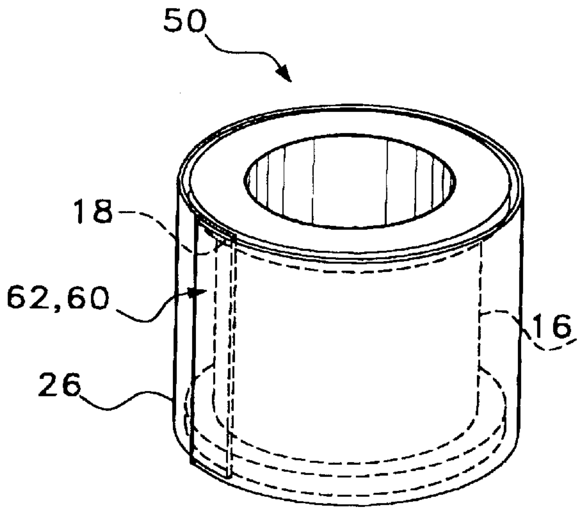
FIG. 5 is a perspective view of the combined spool and film showing a second embodiment of joining edges of the film.

FIG. 5 illustrates yet another embodiment of fixing lateral edges 26*c* and 26*d* of the film 26 together. This figure joins the two lateral edges 26*c* and 26*d* by overlapping the same and securing the edges with any one of a narrow band of sticky tape 60, ultrasonic bonding 62, or the adhesive 40 alone. The resulting seam has even better resonance characteristics than the embodiment of FIG. 3 where adhesive 40 is combined with either one of screws 42 or thermally deformable nails 44. This is due to the fact that the bonded region can vibrate in the same way as the remainder of the film area if the jointed region is free to move.

FIG. 6 illustrates the surface characteristics of the PVDF film 26 modified to enable the securing shown in FIG. 3 and the overlapping and bonding of the overlapped edges shown in FIG. 5. Essentially, the film 26 includes an electrode area 50 formed over substantially the entire inner face 27 thereof. In order to prevent shorting at the overlapped lateral ends 26*c,* 26*d* of the film 26, a portion of the electrode material 26 is removed to provide a non-electrode area 48. Likewise, the electrode material is removed from the upper and lower (longitudinal) edges 26*a,* 26*b* of the film 26 in order to eliminate shorting from surface to surface.

The film 26 is overlapped at the non-electrode areas 48 and the securing by way of adhesive 40, sticky tape 60, ultrasonic bonding 62, or a combination of screws 42 or deformable nails 44 with the adhesive 40 occurs at the overlapped areas. There is not any specific required surface area to be devoted to the non-electrode surface area 48 or to the electrode area 50, as long as a sufficient electrode area 50 is present to accomplish the operating functions of the transducer.

With regard to the electrode material on the film, it is known that silver ink is a good component for the electrode material formed on electrode area 46 because it has a low electrode resistance. However, silver ink gets darker in color when touched, and the darker area may become apparent after an elapsed period of time such as one month. Therefore, the silver ink has to be coated by a thin layer of a transparent or colored layer preferably by spraying painting or screen printing thereon. Another option is to mix silver ink with carbon ink to make the silver ink dark from the outset. This way, any darkening of the silver ink will not be noticeable. It should be noted that this arrangement for the film is applicable to all of FIGS. 2, 3, and 5.

A radius of the spool 10 can be determined by its ultimate application to an end product. For example, if the size of the end product to which the PVDF film 26 is mounted has a diameter of 7~15 mm, the resonance frequency can be determined by Equation (1) above. Young's modulus of PVDF and density are modified by Ag-carbon ink. Accordingly, the parameters to be used for Equation (1) are Young's modulus of PVDF, $Y_P=4\times10^9$ N/m$^2$ Young's modulus of Ag/C ink, $Y_{AgC}=8\times10^9$ N/m$^2$ Thickness of PVDF $t_P$=18–35 micron Thickness of Ag/C ink, $t_{AgC}$=5–10 micron per one side (actually on both sides)

Density of PVDF $P_p$=1800 Kg/m$^3$

Density of Ag/C ink $P_{AgC}$=2000 Kg/m$^3$

Thickness weighted Young's modulus $Y=(Y_p t_P+2Y_{AgC} t_{AgC})/(t_P 2t_{AgC})=6.1\sim5\times10^9$ where $6.1\times10^9$ is the thickest Ag/C and $5\times10^9$ is the thinnest Ag/C.

Thickness weighted density $r=(r_P t_P+2\ r_{AgC} t_{AgC})/(t_P+2t_{AgC})=1900\sim1850$ Kg/m$^3$ where 1900 is the thinnest PVDF and 1850 is the thickest PVDF and $R=3.5\sim7.5\times10^{-3}$m.

Using these parameters, the resonance frequency ranges from 35~81 Khz with 35 Khz being the lowest possible frequency and 81 Khz being the highest possible frequency from the above parameters.

It should be noted that carbon ink is commercially available, however the resistivity thereof is too high such that the electrode resistance is not negligible compared to the transducer impedance which becomes lower at a high frequency. Therefore, carbon ink can be used only for a low frequency device. At an ultrasonic frequency region (high frequency), silver ink is better because of its much lower resistance, but silver tarnishes due to sulfurization. Therefore silver needs surface coating as described above which is an extra process. Thus, a silver-carbon mixture is necessary for high-frequency applications.

Figure 9A:
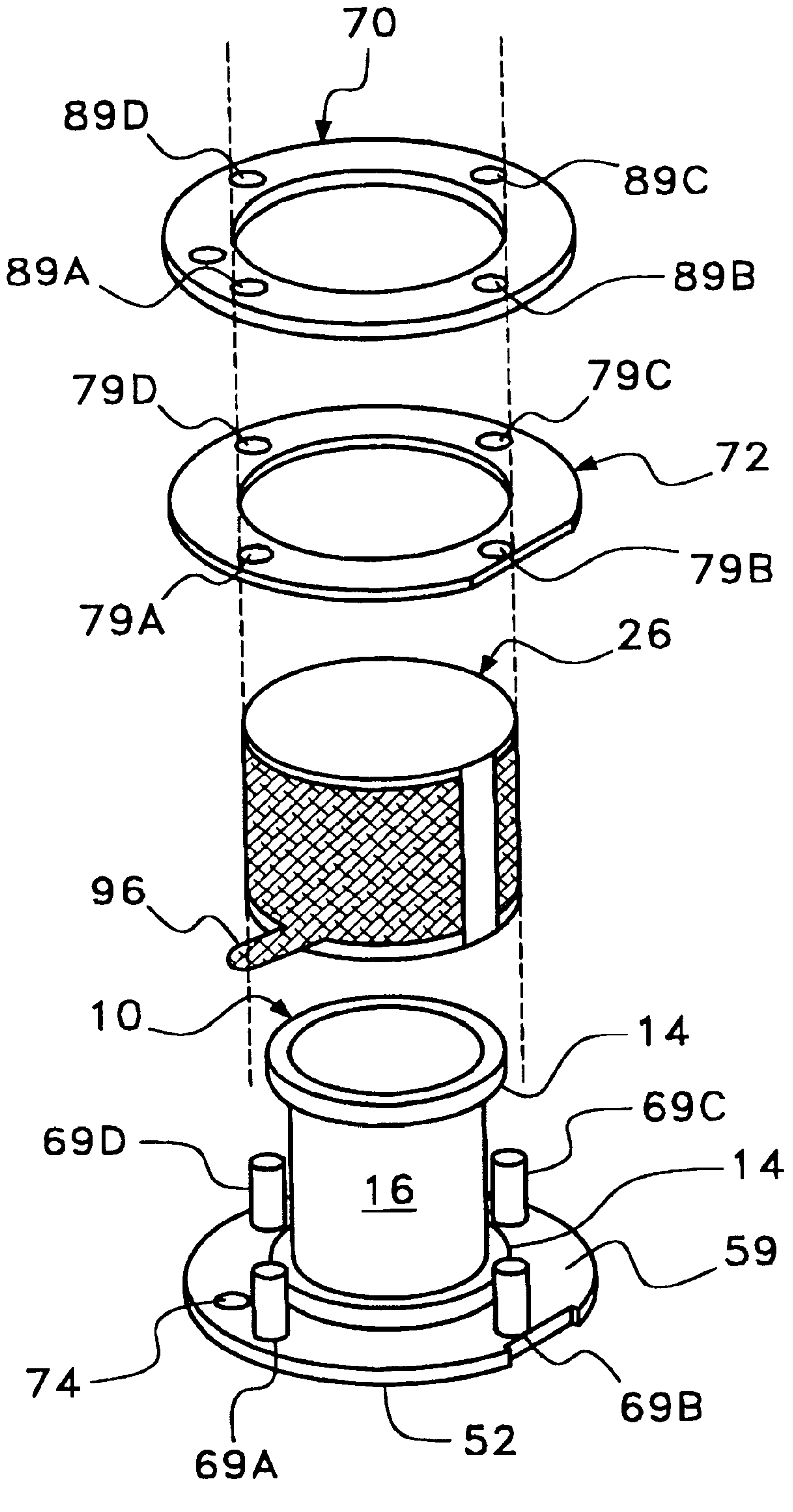
FIG. 9A is a schematic representation of a method for ultrasonically staking the PVDF film disposed on the spool to a printed circuit board according to an aspect of the invention.

Finally, attachment of the assembled transducer apparatus to a printed circuit board can be accomplished in many ways. Two ultrasonic staking methods, illustrated in FIGS. 9A–9B, 10A–10B, are considered to have the lowest cost and most reliability. The first method, depicted in FIG. 9A, is to "sandwich" the PVDF film 26 between the plastic spool 10 and the printed circuit board 70. A moisture tight electrical connection is made by placing a z-axis conductive rubber gasket 72 in between the PVDF cylinder 26 and printed circuit board 70. That is, rubber gasket 72 is conductive in only the z-direction (i.e. vertical direction) and does not conduct in other directions. Two raised pads 74 are disposed on opposite sides of top surface 59 of flanged portion 62 which is coupled to the bottom surface of lower elevation region 14 of spool 10. Flanged portion 52 disposed beneath the lower elevated region extends radially outward a predetermined distance therefrom. The raised pads 74 are made of a non-conductive material upon which PCB 70 rests. The raised pads on the spool create an area of high stress thereby insuring a good electrical connection. The PVDF cylinder does not require any special alignment holes with this method.

In a preferred embodiment, four pins 69A–D are disposed in an approximately equi-distant relationship about the top surface 59 of the spool flange portion 52. The pins 69 are formed generally of the same material as the spool, such as plastic, plexiglass, or any other non-conductive material suitable for ultrasonic staking. The height of the pins are approximately 80–100 mils, depending on the PCB board thickness. Z-axis conductive gasket 72 includes through holes 79A–D which are aligned with each of the corresponding ultrasonically staked pins 69A–D on the spool.

In similar fashion, PCB 70 includes through holes 89A–D which are also in geometric alignment with each of the corresponding pins 69A–D, such that the conductive gasket 72 and PCB 70 engage each of the pins via their respective through holes.

Figure 9B:
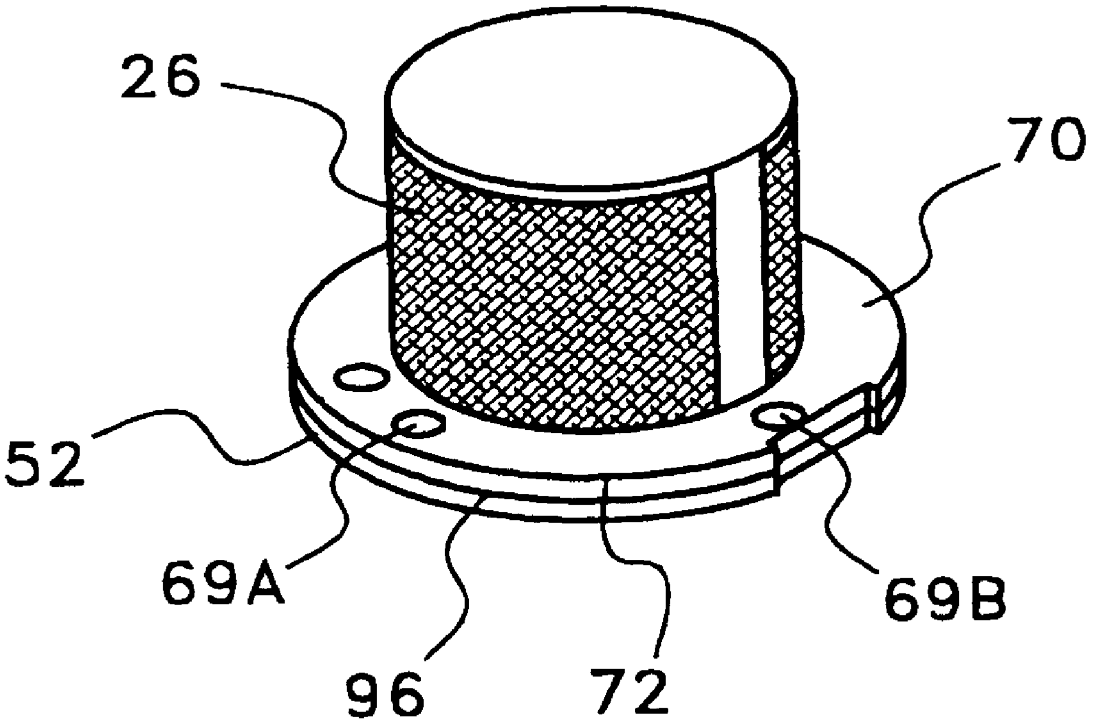
FIG. 9B is a schematic representation of the assembled ultrasonically staked ultrasonic transducer according to the method illustrated in FIG. 9A.

The method for attaching the PVDF cylinder to the PCB leads is as follows: PVDF cylinder 26 is disposed over the body portion and elevated regions of spool 10 so that the bottom surface of PVDF cylinder 26 is in contact engagement with top surface 59 of flange 52. Oppositely disposed tabs 96 radially extending from cylinder 26 and comprised of PVDF electrode material engage and rest upon each of the respective oppositely disposed raised pads 74. Conductive annular gasket 72 is then placed over PVDF cylinder 26 and aligned so that pins 69A–D extend through the corresponding holes 79A–D of the gasket. Annular ring shaped PCB 70 is then disposed on top of gasket 72 and aligned with the spool 10 such that pins 69A–D extend through corresponding holes 89A–D on the printed circuit board. The pins are then ultrasonically staked using well known techniques to provide a conductive lead attachment between the circuit board and the PVDF cylinder as shown in FIG. 9B.

Figure 10A:
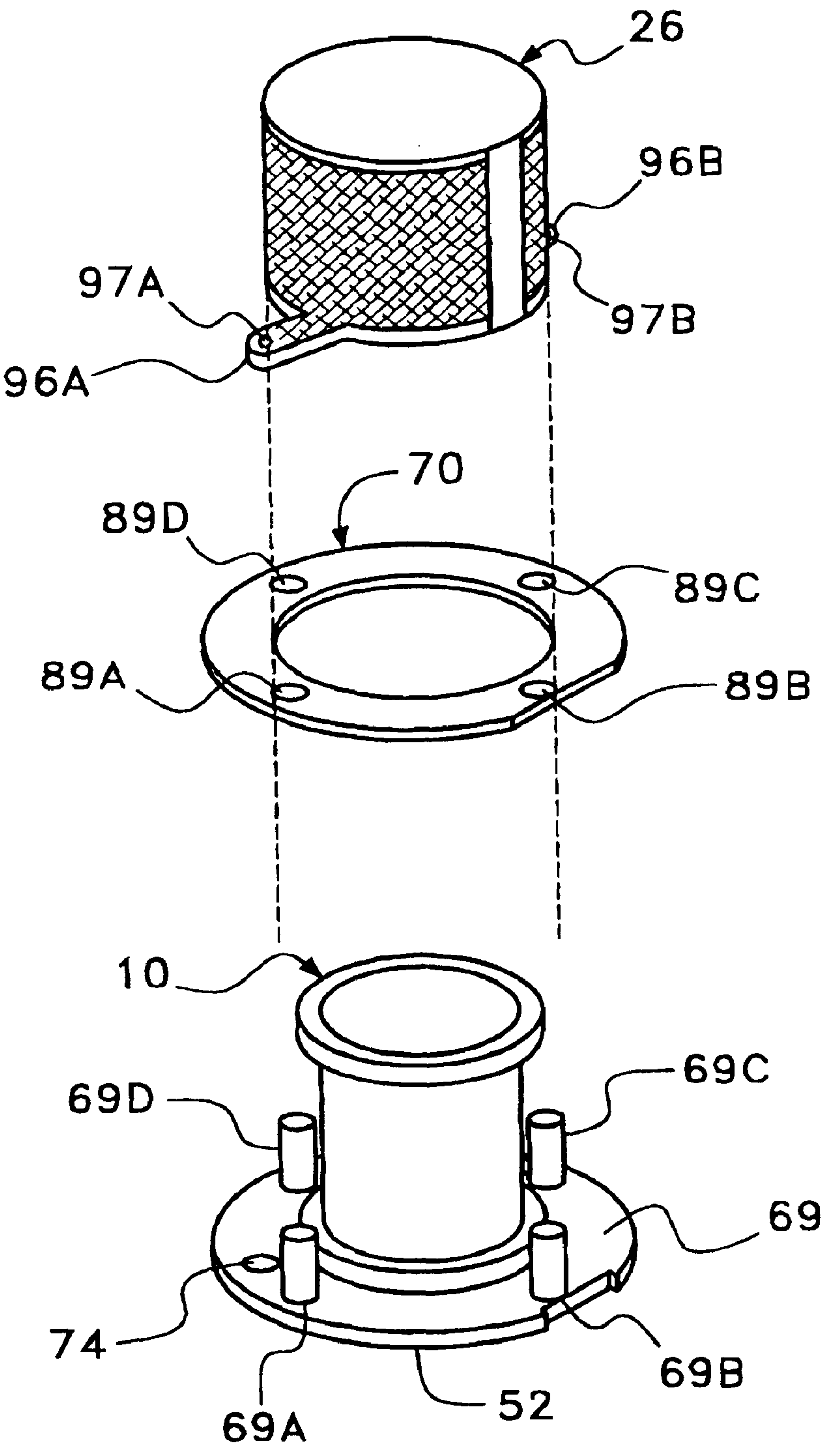
FIG. 10A is a schematic representation of an alternative method for ultrasonically staking the PVDF film disposed on the spool directly to a printed circuit board according to another aspect of the invention.
Figure 10B:
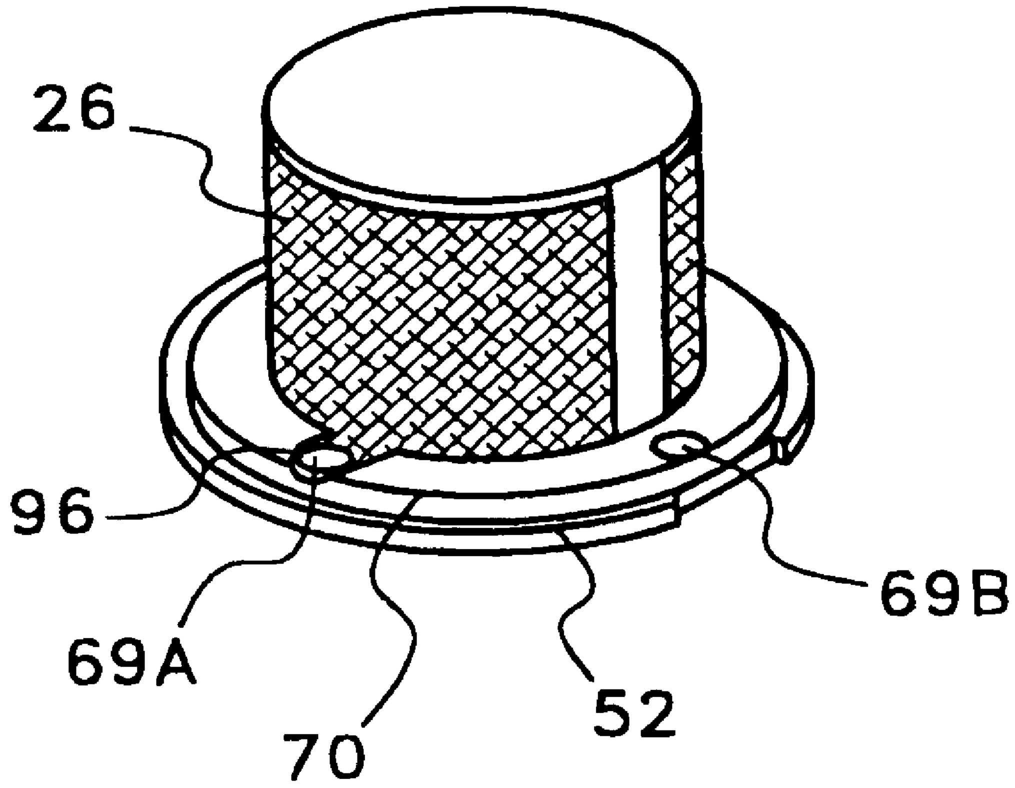
FIG. 10B is a schematic representation of the assembled ultrasonically staked ultrasonic transducer according to the method illustrated in FIG. 10A.

The second method illustrated in FIGS. 10A and 10B, is to ultrasonically stake the PVDF cylinder 26 directly to solder pad holes 89A and 89C on the printed circuit board 70. In this method, the conductive rubber gasket is not required since the direct staking process creates a moisture resistant electrical connection. The oppositely disposed raised pads 74 on the top surface of flange portion 52 of the spool 10 are still utilized to maintain a preload on the ultrasonically staked pins 69A–D. In this method, the PVDF cylinder requires locating holes 97A,B in the corresponding tabs 96A,B of the PVDF film cylinder 26 which align with PCB holes 89A,C as well as with staking pins 69A,C.

Ring-shaped PCB 70 is disposed directly over spool 10 such that each of staking pins 69A–D are aligned with and extend through corresponding through holes 89A–D on PCB 70. In this manner, PCB 70 rests upon and is in contact engagement with each of the oppositely disposed raised pads 74 to provide an area of high stress and to ensure good electrical connectivity. PVDF cylinder 26 is then disposed over the body portions and elevated regions of spool 10, with tab portions 96A and B aligned with staking pins 69A and 69C such that the above staking pins extend through corresponding holes 97A and 97B in each of the tabs. The pins 69A–D are then ultrasonically staked to provide direct lead attachment of the PCB with the PVDF cylinder as shown in FIG. 10B.

The invention having been described, it is clear that certain modifications and variations of the ultrasonic transducer apparatus can be made without departing from the spirit and scope of the invention. These modifications may include application of various materials for the film, spool, and related components, and is intended to include variations in size and shape of the recited components to the extent that they are still able to perform as described.

These obvious modifications and variations are within the theme and spirit of the invention and are considered within the scope of the following claims.

What is claimed is:

1. A transducer apparatus comprising:

a frame member having a body portion and a flanged bottom portion;

a piezoelectric film surrounding said frame member body portion and having a predetermined resonance frequency, said piezoelectric film including an inner surface facing said frame member body portion, an outer surface opposite the inner surface, and an edge surface disposed on said flanged portion of said frame member, and a securing material for securing ends of the piezoelectric film together, said securing material enabling secured ends of said piezoelectric film to have substantially the same resonance frequency as a remainder of said piezoelectric film;

wherein said piezoelectric film is coupled between said frame member and a printed circuit board and electrically coupled thereto by means of ultrasonically staked pins disposed on said flanged bottom portion and in electrical communication with said printed circuit board.

2. The apparatus according to claim 1, further comprising a uniaxially conductive gasket disposed between said piezoelectric film and said printed circuit board.

3. The apparatus according to claim 1, further comprising first and second projections extending from the top surface of said flanged bottom portion for creating an area of high stress over which the printed circuit board is disposed to provide electrical communication.

4. A transducer apparatus comprising:

a frame member having a flanged bottom portion;

a piezoelectric film surrounding said frame member, said piezoelectric film including an inner surface facing said frame member and an outer surface opposite the inner surface and having a predetermined frequency of resonance; and a securing material for securing ends of the piezoelectric film together, said securing material enabling secured ends of said piezoelectric film to have substantially the same resonance frequency as a remainder of said piezoelectric film, wherein said piezoelectric film is sandwichedly coupled between said frame member and a printed circuit board and electrically coupled thereto by means of ultrasonically staked pins disposed on said flange.

5. The apparatus according to claim 4, further comprising a uni-axially conductive gasket disposed between said piezoelectric film and said printed circuit board.

6. The apparatus according to claim 4, further comprising fist and second projections extending from the top surface of said flange for creating an area of high stress over which the printed circuit board is disposed to provide electrical communication.

* * * * *